(12) United States Patent
Fujisawa

(10) Patent No.: US 8,611,177 B2
(45) Date of Patent: Dec. 17, 2013

(54) SEMICONDUCTOR DEVICE INCLUDING LATENCY COUNTER

(75) Inventor: Hiroki Fujisawa, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 23 days.

(21) Appl. No.: 13/317,598

(22) Filed: Oct. 24, 2011

(65) Prior Publication Data

US 2012/0120754 A1    May 17, 2012

(30) Foreign Application Priority Data

Nov. 17, 2010  (JP) ................. 2010-257323

(51) Int. Cl.
*G11C 8/18* (2006.01)

(52) U.S. Cl.
USPC ............. 365/233.11; 365/233.1; 365/236; 365/230.06; 365/239; 365/194

(58) Field of Classification Search
USPC ........... 365/233.11, 233.1, 236, 230.06, 239, 365/194
See application file for complete search history.

(56) References Cited

U.S. PATENT DOCUMENTS

| 5,808,961 | A  | * | 9/1998  | Sawada ................. 365/233.1 |
| 6,449,727 | B1 | * | 9/2002  | Toda ..................... 713/401 |
| 6,738,918 | B2 | * | 5/2004  | Toda ..................... 713/400 |
| 7,345,950 | B2 | * | 3/2008  | Fujisawa et al. ........ 365/233.12 |
| 7,715,272 | B2 | * | 5/2010  | Kinoshita et al. ....... 365/233.11 |
| 7,826,305 | B2 | * | 11/2010 | Fujisawa ............... 365/233.1 |
| 7,898,900 | B2 | * | 3/2011  | Fujisawa ............... 365/233.1 |
| 8,208,340 | B2 | * | 6/2012  | Fujisawa ............... 365/233.1 |
| 8,295,119 | B2 | * | 10/2012 | Fujisawa ............... 365/233.1 |
| 8,358,546 | B2 | * | 1/2013  | Kim et al. ............. 365/194 |
| 2009/0290445 | A1 |   | 11/2009 | Kinoshita et al. |

FOREIGN PATENT DOCUMENTS

JP    2010-003397 A    1/2010

* cited by examiner

*Primary Examiner* — Viet Q Nguyen
(74) *Attorney, Agent, or Firm* — McGinn IP Law Group, PLLC

(57) ABSTRACT

For example, a semiconductor device includes a first latency counter, which selects whether to give an odd-cycle latency to an internal command signal; and a second latency counter, which gives a latency to an internal command signal at intervals of two cycles. The latency counters are connected in series. Since the number of bits in control information, which is used to set a latency, is smaller than the types of settable latency as a result, it is possible to reduce wiring density.

38 Claims, 16 Drawing Sheets

| LATENCY | 0 | 1 | 2 | 3 | 4 | 5 | 6 | 7 | 8 | 9 | 10 | 11 | 12 | 13 |
|---|---|---|---|---|---|---|---|---|---|---|---|---|---|---|
| LE | H | L | H | L | H | L | H | L | H | L | H | L | H | L |
| L0 | H | H | L | L | L | L | L | L | L | L | L | L | L | L |
| L2 | L | L | H | H | L | L | L | L | L | L | L | L | L | L |
| L4 | L | L | L | L | H | H | L | L | L | L | L | L | L | L |
| L6 | L | L | L | L | L | L | H | H | L | L | L | L | L | L |
| L8 | L | L | L | L | L | L | L | L | H | H | L | L | L | L |
| L10 | L | L | L | L | L | L | L | L | L | L | H | H | L | L |

FIG.4

| LATENCY | 0 | 1 | 2 | 3 | 4 | 5 | 6 | 7 | 8 | 9 | 10 | 11 | 12 | 13 |
|---|---|---|---|---|---|---|---|---|---|---|---|---|---|---|
| L0 | H | L | L | L | L | L | L | L | L | L | L | L | L | L |
| L1 | L | H | L | L | L | L | L | L | L | L | L | L | L | L |
| L2 | L | L | H | L | L | L | L | L | L | L | L | L | L | L |
| L3 | L | L | L | H | L | L | L | L | L | L | L | L | L | L |
| L4 | L | L | L | L | H | L | L | L | L | L | L | L | L | L |
| L5 | L | L | L | L | L | H | L | L | L | L | L | L | L | L |
| L6 | L | L | L | L | L | L | H | L | L | L | L | L | L | L |
| L7 | L | L | L | L | L | L | L | H | L | L | L | L | L | L |
| L8 | L | L | L | L | L | L | L | L | H | L | L | L | L | L |
| L9 | L | L | L | L | L | L | L | L | L | H | L | L | L | L |
| L10 | L | L | L | L | L | L | L | L | L | L | H | L | L | L |
| L11 | L | L | L | L | L | L | L | L | L | L | L | H | L | L |
| L12 | L | L | L | L | L | L | L | L | L | L | L | L | H | L |

FIG.7

| LATENCY | 0 | 1 | 2 | 3 | 4 | 5 | 6 | 7 | 8 | 9 | 10 | 11 | 12 | 13 |
|---|---|---|---|---|---|---|---|---|---|---|---|---|---|---|
| LE | H | L | H | L | H | L | H | L | H | L | H | L | H | L |
| L0 | H | H | L | L | L | L | L | L | L | L | L | L | L | L |
| L2 | L | L | H | H | L | L | L | L | L | L | L | L | L | L |
| L4 | L | L | L | L | H | H | L | L | L | L | L | L | L | L |
| L6 | L | L | L | L | L | L | H | H | L | L | L | L | L | L |
| L8 | L | L | L | L | L | L | L | L | H | H | L | L | L | L |
| L10 | L | L | L | L | L | L | L | L | L | L | H | H | L | L |
| LF | H | H | H | H | H | H | H | H | H | H | H | H | L | L |

US 8,611,177 B2

SEMICONDUCTOR DEVICE INCLUDING LATENCY COUNTER

BACKGROUND OF THE INVENTION

1. Field of the Invention

The present invention relates to a semiconductor device, and particularly to a semiconductor device including a latency counter that delays an internal command signal.

2. Description of Related Art

A synchronous memory device, represented by a synchronous DRAM (Dynamic Random Access Memory), has been widely used for a main memory of a personal computer and the like. The synchronous memory device inputs or outputs data in synchronization with a clock signal supplied from a controller. Therefore, the use of a higher-speed clock leads to an increase in data transfer rate.

However, even in the synchronous DRAM, a DRAM core still operates in an analog mode, requiring a sense operation to amplify extremely weak electric charges. As a result, it is not possible to reduce the time required to output the first data after a read command is issued. Therefore, after a predetermined delay time has passed since the issuing of the read command, the first data are output in synchronization with an external clock signal.

The delay time in the read operation is usually referred to as "CAS latency," and is set to the integral multiple of a clock cycle. For example, when the CAS latency is five (CL=5), the first data are output in synchronization with an external clock signal that appears five cycles after a read command is captured in synchronization with an external clock signal. That is, five clock cycles later, the first data are output.

Such a delay is necessary even for a write operation. In the write operation, after a predetermined delay time has passed since the issuing of a write command, data need to be input sequentially in synchronization with external clock signal. The delay time in the write operation is usually referred to as "CAS write latency," and is set to the integral multiple of a clock cycle. For example, when the CAS write latency is five (CWL=5), the first data need to be input in synchronization with an external clock signal that appears five clock cycles after the write command is captured in synchronization with an external clock signal.

Moreover, what is employed by a DDR2 (Double Data Rate 2) or later model SDRAM is a Posted CAS method, which enables a controller to issue a read or write command to asynchronous memory device at an earlier timing than an original issuing timing. How far the command issuing timing is moved forward, i.e. the difference between the original timing at which the read or write command should be issued and the actual, earlier timing at which the read or write command is issued, is referred to as additive latency (AL). Therefore, in the read operation for example, the period required to start outputting read data after the read command is issued is defined as AL+CL.

When the Posted CAS method is employed, a semiconductor device (synchronous memory device) does not start a column-system control circuit immediately after a memory controller issues a read or write command. The semiconductor device needs to wait to start the column-system control circuit until the additive latency has passed. What is used for the above purpose is a FIFO circuit that delays a read or write command, which is supplied from the outside, in the semiconductor device. Such a FIFO circuit is generally referred to as a "latency counter." The most commonly used latency counter is a shift register.

An inventor of the present invention has previously proposed a new latency counter (Japanese Patent Application Laid-Open No. 2010-3397). The latency counter disclosed in Japanese Patent Application Laid-Open No. 2010-3397 uses a circuitry section, which selects whether a latency is an odd or even number, and a circuitry section, which gives a delay to an internal command signal at intervals of two clock cycles; the circuitry sections are connected in parallel to make circuits smaller in size and reduce power consumption. In recent years, the pace at which the wiring pitch is reduced has not kept up with the pace at which transistors become smaller in size. As a result, a new issue has arisen that as a circuit is made smaller in size, sufficient numbers of lines of the circuit cannot be formed on the top of the circuit.

SUMMARY

In one embodiment, there is provided a semiconductor device that includes: a first register supplied with an internal command signal; a second register supplied with an output signal of the first register; a first selector that supplies an output node thereof with one of output signals of the first and second registers in an alternative based on a first control signal; and a plurality of synchronous circuits including at least first and second synchronous circuits, each of the synchronous circuits including a third register, a fourth register, a second selector and first to fourth nodes, wherein each of the first nodes is connected to an input node of the third register of the same synchronous circuit, each of the second node is connected to an output node of the second selector of the same synchronous circuit, an output signal of each of the third registers is supplied to an input node of the fourth register of the same synchronous circuit, an output signal of each of the fourth registers is supplied to a first input node of the second selector of the same synchronous circuit, each of the third nodes is connected to a second input node of the second selector of the same synchronous circuit, each of the fourth nodes is connected to a third input node of the second selector of the same synchronous circuit, each of the second selector alternatively connects one of the first and second input nodes thereof to the second node of the same synchronous circuit based on a logic level of the fourth node of the same synchronous circuit, the third nodes of the synchronous circuits are connected in common to the output node of the first selector, each of the fourth nodes of the synchronous circuits is supplied with an associated bit of second control signals, the first node of first synchronous circuit is connected to the output node of the first selector, the second node of the first synchronous circuit is connected to the first node of the second synchronous circuit, each of the first to fourth registers is a shift register that transmits the internal command signal in response to a synchronous signal, the internal command signal supplied to the first register is output from the second register after two cycles of the synchronous signal, and the internal command signal supplied to the third register is output from the fourth register after two cycles of the synchronous signal.

In another embodiment, there is provided a semiconductor device that includes: a command input line; a command output line; and first and second latency counters connected in series between the command input line and the command output line, wherein one of the first and second latency counters supplies an internal command signal to the command output line when a predetermined latency elapses after the internal command signal is supplied to the other of the first and second latency counters from the command input line, the first latency counter selects whether to give the internal command signal an odd-cycle latency based on first control information, and the second latency counter gives the internal command signal a latency at intervals of two cycles based on second control information.

According to the present invention, the number of bits in control information, which is used to set a latency, is reduced, resulting in a decrease in the density of wiring, which is used to transmit the control information.

BRIEF DESCRIPTION OF THE DRAWINGS

The above and other features and advantages of the present invention will be more apparent from the following description of certain preferred embodiments taken in conjunction with the accompanying drawings, in which:

FIG. 4 is a table showing relationships between values of control signals LE and L0 to L10 and latencies in the latency counter 100 shown in FIG. 3 or a latency counter 200;

FIG. 7 is a table showing relationships between values of control signals L0 to L12 and latencies in the latency counter 300 shown in FIG. 6;

DETAILED DESCRIPTION OF PREFERRED EMBODIMENTS

A representative example of the technical concept of the present invention for solving the events will be described below. It will be understood that what is claimed by the present invention is not limited to such a technical concept and is set forth in the claims of the present invention. That is, a technical concept of the present invention is that the following counters are connected in series: a first latency counter, which selects whether to give an odd-cycle latency to an internal command signal supplied, and a second latency counter, to which an output of the first latency counter is supplied and which selects whether to give a latency at intervals of two cycles to the internal signal or an internal signal that is given the odd-cycle latency. As a result, the bits of control information, which is used to set a latency, are smaller in number than the types of settable latency. Therefore, it is possible to reduce wiring density.

Figure 1:
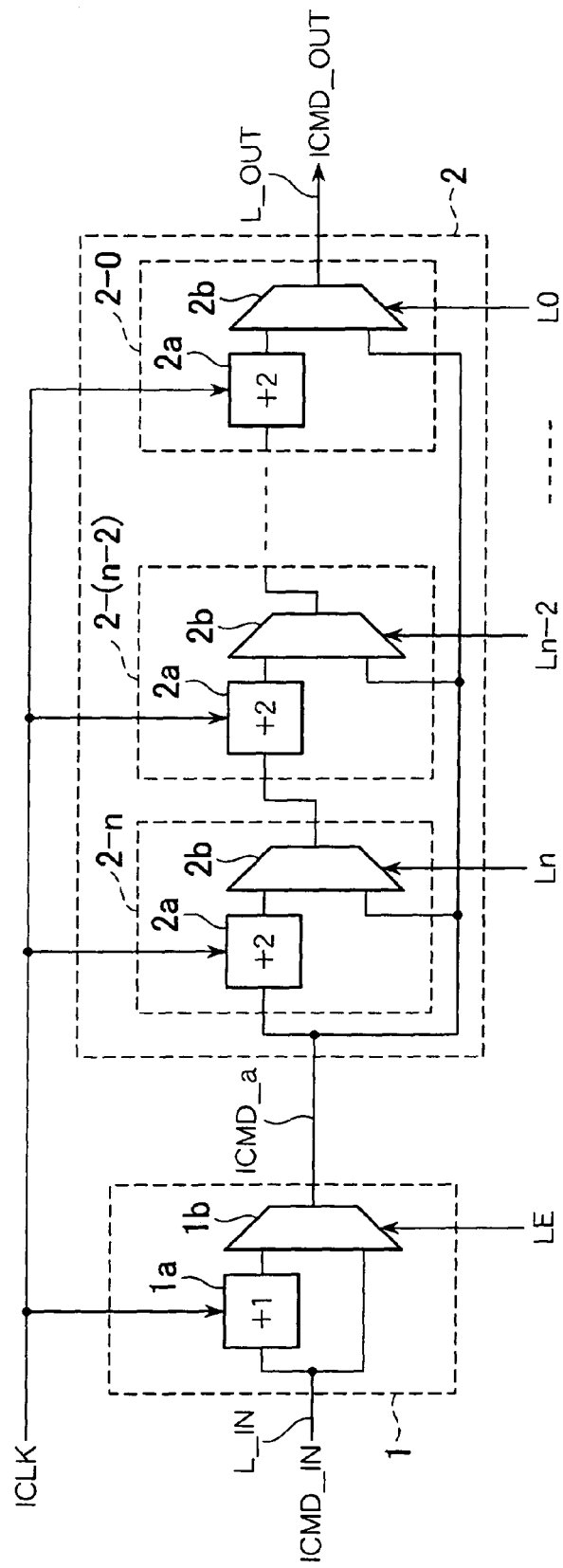
FIG. 1 is a block diagram indicative of an embodiment of the present invention.

Referring now to FIG. 1, a semiconductor device according to an embodiment of the present invention is configured by connecting the following counters in series: a first latency counter 1, which selects whether to give a latency of one clock cycle to an internal command signal ICMD_IN; and a second latency counter 2, which selects whether to give a latency to an internal command signal LCMD_a at intervals of two clock cycles. The internal command signal ICMD_IN is supplied via a command input line L_IN. The internal command signal ICMD_OUT is output via a command output line L_OUT. The internal command signal ICMD_a is an output signal of the first latency counter 1 and an input signal of the second latency counter 2. The first and second latency counters 1 and 2 are circuits that synchronize with an internal clock signal ICLK.

The latency counter 1 includes a register 1a, which latches the internal command signal ICMD_IN in synchronization with the internal clock signal ICLK; and a selector 1b, which selects the internal command signal that has passed through the register 1a or the internal command signal that has not passed through the register 1a. The register 1a is a circuit that latches the internal command signal ICMD_IN in synchronization with a rising edge of the internal clock signal ICLK, for example. As a result, the internal command signal that has passed through the register 1a is delayed by one clock cycle. The selector 1b includes two input nodes and one output node; one of the two input nodes is electrically connected to the output node. The selection by the selector 1b is performed based on a first control signal LE.

The latency counter 2 is made by connecting the following circuits in series: a plurality of synchronous circuits 2-n to 2-0, each of which gives a delay of two clock cycles to an internal command signal ICMD_a that has passed through the latency counter 1. The synchronous circuits 2-n to 2-0 each have a similar circuit configuration to the latency counter 1, including a register 2a, which gives a delay of two clock cycles by latching an input internal command signal in synchronization with the internal clock signal ICLK, and a selector 2b, which selects the internal command signal that has passed through the register 2a or the internal command signal that has not passed through the register 2a. The register 2a is a circuit, in which two registers are connected in series, that latches the internal command signal ICMD_IN in synchronization with a rising edge of the internal clock signal ICLK, for example. As a result, the internal command signal that has passed through the register 2a is delayed by two clock cycles. Each of a plurality of selectors 2b includes two input nodes and one output node; one of the two input nodes is electrically connected to the output node. The selection by each of the selectors 2b is performed based on a corresponding bit of a plurality of second control signals L0 to Ln.

Input nodes of registers 2a in the synchronous circuits 2-(n-2) to 2-0 are connected to output nodes of the preceding synchronous circuits 2-n to 2-2, respectively. To the other input nodes of the selectors 2b in the synchronous circuits 2-n to 2-0, the internal command signal ICMD_a is commonly supplied. Even to an input node of the register 2a in the first synchronous circuit 2-n, the internal command signal ICMD_a is supplied. From the output node of the last synchronous circuit 2-0, the internal command signal ICMD_OUT is output.

A control signal LE and the control signals L0 to Ln are signals used to set a latency. Among the above controls signals, the control signal LE is a one-bit signal, which is used to select whether to set the latency associated with the internal clock signal ICLK to an even or odd number. The control signals L0 to Ln is signals that each use an even value to represent latencies, with one of bits at an active level. Activated one of the control signals Ln to L0 causes an output node of a corresponding register 2a and an output node of a corresponding selector 2b to be electrically connected. The other of the control signals Ln to L0 which are all inactivated causes the output node of the selector 1b and an output node of a corresponding selector 2b to be electrically connected so that a corresponding register 2a is bypassed.

With the above configuration, the types of latency that can be given to an internal command signal ICMD_IN range from 0 to n+1. For example, when the latency is set to 0, all that is required is as follows: activating the control signal LE so that an even number is selected, i.e. the register 1a is bypassed; and activating the control signal L0 so that the register 2a in the synchronous circuit 2-0 is bypassed. When the latency is set to 1, all that is required is as follows: activating the control signal LE so that an odd number is selected, which means a passage through the register 1a; and activating the control signal L0 so that the register 2a in the synchronous circuit 2-0 is bypassed. When the latency is set to 2, all that is required is as follows: activating the control signal LE so that an even number is selected, i.e. the register 1a is bypassed; activating the control signal L2 (not shown) that is associated with the selector 2b of the synchronous circuit 2-2 (not shown) that precedes the synchronous circuit 2-0 so that the register 2a of the synchronous circuit 2-2 is bypassed; and inactivating the control signal L0 to force a passage through the register 2a in the synchronous circuit 2-0. When the latency is set to 3, all that is required is as follows: activating the control signal LE so that an odd number is selected, which means a passage through the register 1a; activating the control signal L2 that is associated with the selector 2b of the synchronous circuit 2-2 that precedes the synchronous circuit 2-0 so that the register 2a of the synchronous circuit 2-2 is bypassed; and inactivating the control signal L0 to force a passage through the register 2a in the synchronous circuit 2-0. When the latency is greater than 3, all that is required is to control the selector 2b of corresponding one of the synchronous circuits 2-4 to 2-n so that the internal command signal ICMD_a passes more than one synchronous circuits included in the latency counter 2. Incidentally, when the latency is set to n+1, all that is required is as follows: activating the control signal LE so that an odd number is selected, which means a passage through the register 1a; one of the control signals L0 to Ln associated with number n is activated so that the internal command signal ICMD_a passes respective number of synchronous circuits included in the latency counter 2.

According to the above configuration, the number of lines for the control signals LE and L0 to Ln, which are used to set the latency, is reduced. Therefore, it is possible to reduce the wiring density. Moreover, the configuration of the second latency counter 2, which counts the latency at intervals of two clock cycles, helps to reduce the number of the registers 2a. Accordingly, a signal load of the internal command signal ICMD_a is reduced. Thus, it is possible to increase an operating speed.

Preferred embodiments of the present invention will be explained below in detail with reference to the accompanying drawings.

Figure 2:
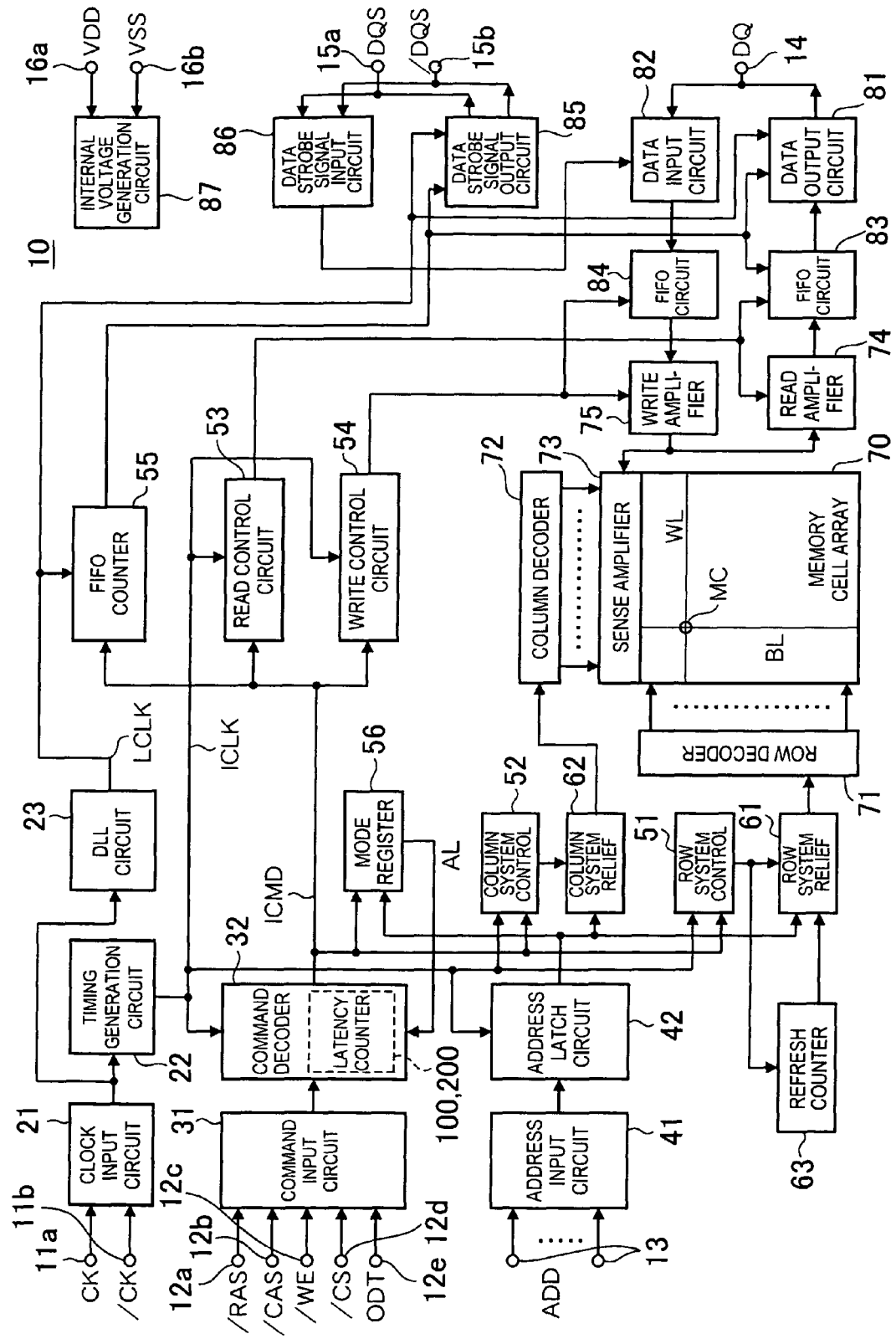
FIG. 2 is a block diagram showing the overall configuration of a semiconductor device 10 according to another embodiment of the present invention.

Turning to FIG. 2, the semiconductor device 10 of the present embodiment is a synchronous DRAM, which includes the following external terminals: clock terminals 11a and 11b, command terminals 12a to 12e, address terminals 13, a data input/output terminal 14, data strobe terminals 15a and 15b, and power-supply terminals 16a and 16b. Besides the above terminals, a calibration terminal, a clock enable terminal and other terminals are included, but are not shown in the diagram.

The clock terminals 11a and 11b are terminals to which clock signals CK and /CK are respectively supplied. The supplied clock signals CK and /CK are supplied to a clock input circuit 21. In the present specification, a signal whose name starts with "/" is an inversion or low-active signal of the corresponding signal. Accordingly, the clock signals CK and /CK are complementary to each other. An output of the clock input circuit 21 is supplied to a timing generation circuit 22 and a DLL circuit 23. The timing generation circuit 22 plays a role in generating an internal clock signal ICLK, which has the same clock cycle as that of an external clock signal CK, and supplying the internal clock signal ICLK to various internal circuits except circuits of a data output system. The DLL circuit 23 plays a role in generating an output clock signal LCLK and supplying the output clock signal LCLK to circuits of the data output system.

The output clock signal LCLK generated by the DLL circuit 23 is a signal that is obtained by controlling phases of the clock signals CK and /CK. The phase of read data DQ is shifted forward by a small amount relative to the clock signals CK and /CK so that the phase of the read data DQ (and data strobe signals DQS and /DQS) matches the phases of the clock signals CK and /CK.

The command terminals 12a to 12e are terminals to which the following signals are respectively supplied: a row address strobe signal /RAS, a column address strobe signal /CAS, a write enable signal /WE, a chip select signal /CS, and an on die termination signal ODT. The above command signals are supplied to a command decoder 32 via a command input circuit 31. With the chip select signal /CS enabled, the command decoder 32 generates eight patterns of a plurality of internal command signals for the logic of each of the following signals: the row address strobe signal /RAS, the column address strobe signal /CAS, and the write enable signal /WE. Furthermore, the command decoder 32 is a circuit that carries out a process of holding a command signal and other processes in synchronization with the internal clock signal ICLK to generate a plurality of internal commands ICMD. The process of holding the command signal, i.e. an operation of counting latencies, is performed by a latency counter 100 or 200 in the command decoder 32. The amount of delay by the latency counter 100 or 200 can vary according to a set value AL, which is set in a mode register 56. An internal command generated by the command decoder 32 is supplied to a row system control circuit 51, a column system control circuit 52, a read control circuit 53, a write control circuit 54, a FIFO counter 55, the mode register 56 and the likes. The FIFO counter 55 is a circuit that generates various timing signals after a read or write command is issued so that each circuit block of a column system operates at a predetermined timing.

The address terminals 13 are terminals to which an address signal ADD is supplied. The supplied address signal ADD is supplied to an address latch circuit 42 via an address input circuit 41. The address latch circuit 42 latches the address signal ADD in synchronization with the internal clock signal ICLK. Among the address signals ADD latched by the address latch circuit 42, a row address is supplied to a row system relief circuit 61, and a column address to a column system relief circuit 62. To the row system relief circuit 61, a row address generated by a refresh counter 63 is also supplied. Moreover, when entry is performed in a mode register set, the address signal ADD is supplied to the mode register 56.

When a row address indicating a defective word line is supplied, the row system relief circuit 61 relieves the row address by accessing a redundant word line instead of the original word line. An operation of the row system relief circuit 61 is controlled by the row system control circuit 51, and an output thereof is supplied to a row decoder 71. The row decoder 71 is a circuit that selects one of word lines WL that a memory cell array 70 contains. As shown in FIG. 2, in the memory cell array 70, a plurality of word lines WL and a plurality of bit lines BL cross each other; at points where the word lines WL and the bit lines BL cross each other, memory cells MC are disposed (In FIG. 2, only one word line WL, one bit line BL and one memory cell MC are shown). The bit lines BL are connected to corresponding sense amplifiers 73.

When a column address indicating a defective bit line is supplied, the column system relief circuit 62 relieves the column address by accessing a redundant bit line instead of the original bit line. An operation timing of the column system relief circuit 62 is controlled by the column system control circuit 52, and an output thereof is supplied to a column decoder 72. The column decoder 72 is a circuit that selects one of sense amplifiers 73 that the memory cell array 70 contains. A sense amplifier 73 selected by the column decoder 72 is connected to a read amplifier 74 during a read operation, or to a write amplifier 75 during a write operation. An operation of the read amplifier 74 is controlled by the read control circuit 53. An operation of the write amplifier 75 is controlled by the write control circuit 54.

The data input/output terminal 14 is a terminal for outputting read data DQ and inputting write data DQ, and is connected to a data output circuit 81 and a data input circuit 82. The data output circuit 81 is connected to the read amplifier 74 via a FIFO circuit 83. Therefore, a plurality of pieces of read data DQ pre-fetched is output in burst mode from the data input/output terminal 14. The data input circuit 82 is connected to the write amplifier 75 via a FIFO circuit 84. Therefore, a plurality of pieces of write data DQ input from the data input/output terminal 14 in burst mode is simultaneously written into the memory cell array 70.

The data strobe terminals 15a and 15b are terminals for inputting and outputting data strobe signals DQS and /DQS, respectively, and are connected to a data strobe signal output circuit 85 and a data strobe signal input circuit 86.

As shown in FIG. 2, to the data output circuit 81 and the data strobe signal output circuit 85, the output clock signal LCLK, which is generated by the DLL circuit 23, and a timing signal, which is generated by the FIFO counter 55, are supplied.

The power-supply terminals 16a and 16b are terminals to which power supply potentials VDD and VSS are respectively supplied, and are connected to an internal voltage generation circuit 87. The internal voltage generation circuit 87 generates various kinds of internal voltage.

The above has described the overall configuration of the semiconductor device 10 according to the present embodiment. The following describes the latency counter 100 in the semiconductor device 10.

Figure 3:
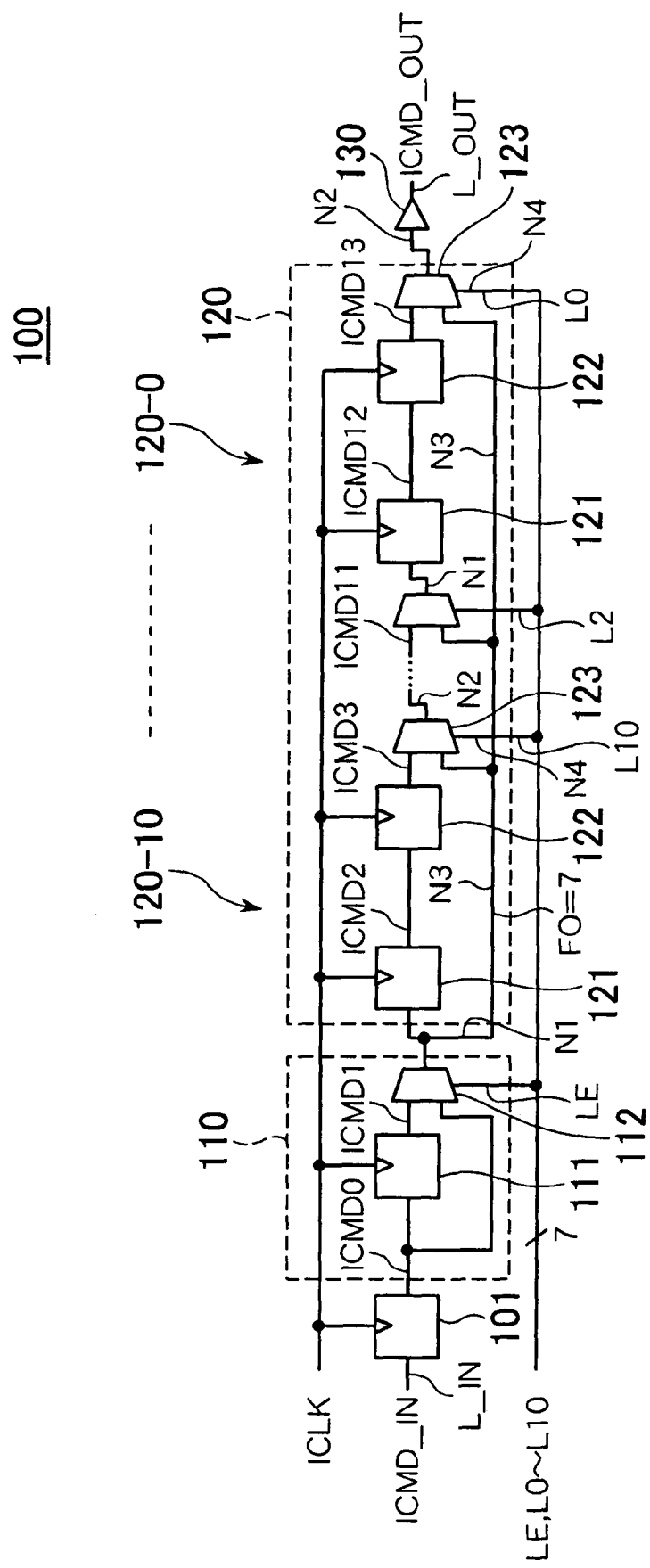
FIG. 3 is a circuit diagram showing a latency counter 100 shown in FIG. 2 according to a first embodiment.

Turning to FIG. 3, the latency counter 100 of the first embodiment is formed by connecting the following components in series: a register 101, which latches an internal command signal ICMD_IN; a first latency counter 110, which selects whether to give a latency of one clock cycle to an internal command signal ICMD0 output from the register 101; and a second latency counter 120, which gives a latency to an internal command signal output from the latency counter 110 at intervals of two cycles. An internal command signal ICMD_IN is supplied via a command input line L_IN. An internal command signal ICMD_OUT is output via a command output line L_OUT. The internal command signal ICMD_IN is equivalent to one of the internal command signals, which are generated inside the command decoder 32 (FIG. 2) and have eight patterns. The internal command signal ICMD_OUT is equivalent to one of the internal commands ICMD (FIG. 2) output from the command decoder 32.

To an input node of the register 101 (first register), the internal command signal ICMD_IN is supplied; to a clock node of the register 101, the internal clock signal ICLK is supplied. In synchronization with a rising edge of the internal clock signal ICLK, the register 101 latches the internal command signal ICMD_IN. From an output node of the register 101, the internal command signal ICMD0 latched is output. The internal command signal ICMD0 is supplied to the first latency counter 110.

The first latency counter 110 includes a register 111 (second register), which latches the internal command signal ICMD0 in synchronization with the internal clock signal ICLK; and a selector 112 (first selector), which selects an internal command signal ICMD1 output from the register 111 or the internal command signal ICMD0 output from the register 101. To an input node of the register 111, the internal command signal ICMD0 is supplied; to a clock node of the register 111, the internal clock signal ICLK is supplied. In synchronization with a rising edge of the internal clock signal ICLK, the register 111 latches the internal command signal ICMD0. From an output node of the register 111, the internal command signal ICMD1 latched is output. As a result, the internal command signal ICMD1 that has passed through the register 111 is delayed by one clock cycle. The selection by the selector 112 is conducted based on a first control signal LE. More specifically, when the control signal LE is at a high level, the internal command signal ICMD0 is selected. When the control signal LE is at a low level, the internal command signal ICMD1 is selected. To a first input node of the selector 112, the internal command signal ICMD1 is supplied. To a second input node of the selector 112, the internal command signal ICMD0 is supplied.

The second latency counter 120 is made by connecting a plurality of synchronous circuits 120-10 to 120-0 in series: The synchronous circuits 120-10 to 120-0 give a delay of two clock cycles to the internal command signal ICMD0 or ICMD1 (first signal) that has passed through the first latency counter 110.

Each of the synchronous circuits 120-10 to 120-0 includes registers 121 and 122 (third and fourth registers), whose clock nodes are supplied with the internal clock signal ICLK; a selector 123 (second selector); and first to fourth nodes N1 to N4. The first node N1 is an input node of the register 121. The second node N2 is an output node of the selector 123. The third node N3 is the second input node of the selector 123. The fourth node N4 is a selection node of the selector 123. An output of the register 121 is supplied to an input node of the register 122. An output of the register 122 is supplied to the first input node of the selector 123.

Therefore, the selector 123 selects the first input node or the second input node on the basis of the logic of a control signal supplied from the fourth node, and then outputs the selected one to the second node N2. More specifically, when corresponding second control signals L10 to L0 are at a low level, an output of the register 122 is selected. When corresponding control signals L10 to L0 are at a high level, the internal command signal ICMD0 or ICMD1 output from the first latency counter 110 is selected.

The third nodes N3 of the synchronous circuits 120-10 to 120-0 described above are commonly connected to an output node of the selector 112. Therefore, to the third nodes N3 described above, the internal command signal ICMD0 or ICMD1 that has passed through the first latency counter 110 is commonly supplied. With the above configuration, each time an internal command signal passes through one of the synchronous circuits 120-10 to 120-0, the internal command signal turns out to be delayed by two clock cycles.

To selection nodes of the selectors 123 that are each included in the synchronous circuits 120-10 to 120-0, corresponding bits of the second control signals L10 to L0 are supplied. As a result, the internal command signal ICMD0 or ICMD1 that has passed through the latency counter 110 is supplied into one of the synchronous circuits 120-10 to 120-0.

Then, an internal command signal output from the last synchronous circuit 120-0 is output via a buffer 130 as an internal command signal ICMD_OUT. According to the above configuration, the types of latency given to the internal command signal ICMD_IN can take values of 0 to 13.

Turning to FIG. 4, when the latency is set to an even number, the control signal LE is set at a high level. When the latency is set to an odd number, the control signal LE is set at a low level. In other words, when a one-clock-cycle count process is not performed by the first latency counter 110, the control signal LE is set at a high level. When a one-clock-cycle count process is performed by the first latency counter 110, the control signal LE is set at a low level. When any Li (i is equal to an even number ranging from 0 to 10) of the control signals L0 to L10 becomes activated, an i-clock-cycle count process is performed by the second latency counter 120.

Since the latency counters 110 and 120 are connected in series, the settable latency is an arbitrary value ranging from 0 to 13. In this manner, according to the present embodiment, there are 14 settable types of latency. On the other hand, seven bits of the control signals LE and L0 to L10 are enough to set the latency. Thus, it is possible to reduce the density of wiring, which is used to transmit control signals.

Figure 5:
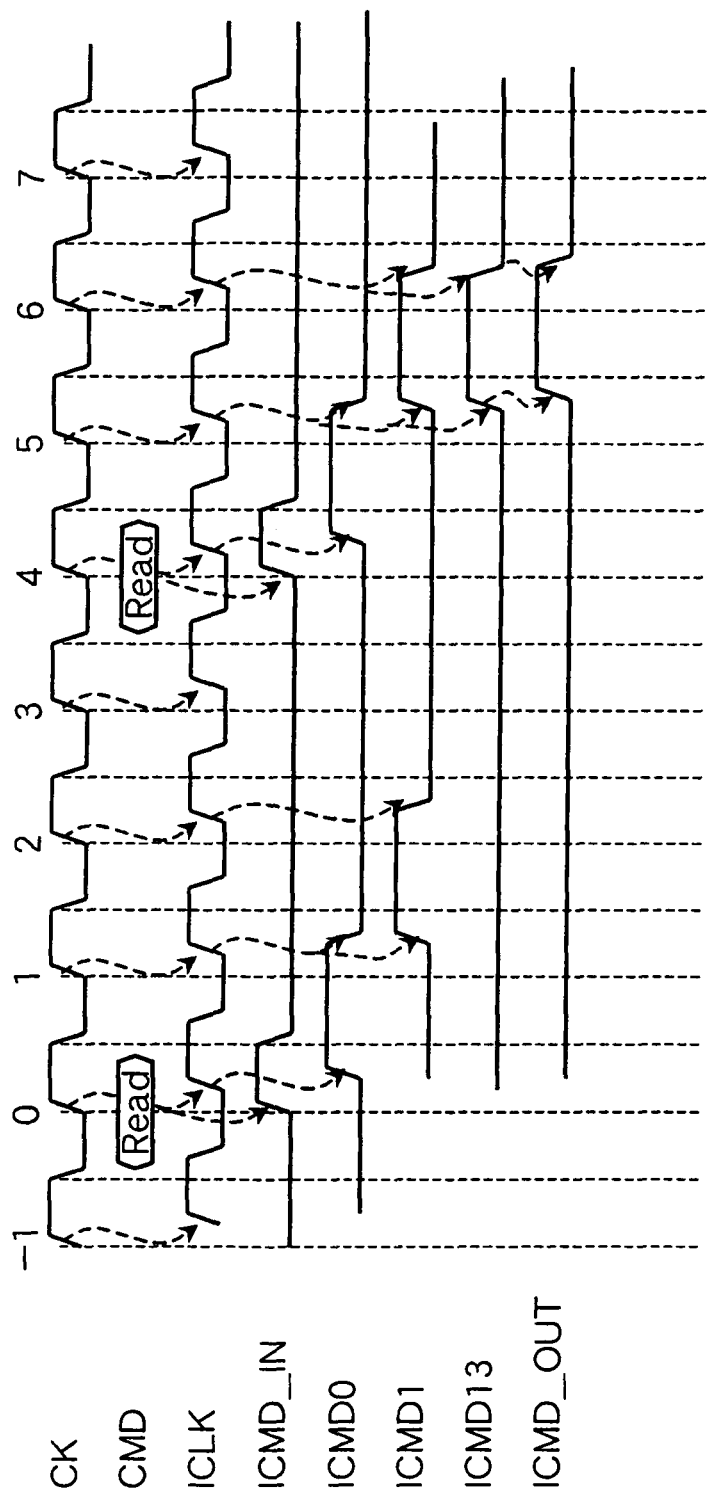
FIG. 5 is a waveform diagram illustrating an operation of the latency counter 100 shown in FIG. 3.

In the example shown in FIG. 5, the latency is set to five (AL=5). Accordingly, a control signal LE is at a low level, and a control signal L4 at a high level (See FIG. 4). As shown in FIG. 5, after a read command READ is issued in synchronization with active edge 0 of an external clock signal CK, the command decoder 32 generates the internal command signal ICMD_IN. The internal command signal ICMD_IN is latched by the register 101 shown in FIG. 3. As a result, what is generated is the internal command signal ICMD0 that is in synchronization with active edge 0 of the internal clock signal ICLK.

The internal command signal ICMD0 is latched by the register 111 in the latency counter 110; what is generated is the internal command signal ICMD1 that is in synchronization with active edge 1 of the internal clock signal ICLK. In the present example, the control signal LE is at a low level. Therefore, the selector 112 selects the internal command signal ICMD1, and outputs the internal command signal ICMD1 to the latency counter 120.

In the latency counter 120, the control signal L4 is activated to the high level. As a result, the internal command signal ICMD1 is captured by the synchronous circuit 120-4, which is the second before from the last synchronous circuit. Accordingly, a delay of four clock cycles is given by four registers in total, which are contained in the synchronous circuit 120-2, which is the first before from the last synchronous circuit, and in the last synchronous circuit 120-0.

As a result, a total delay of five clock cycles is given by the latency counters 110 and 120, and an internal command signal ICMD_OUT is output in synchronization with active edge 5 of the internal clock signal ICLK.

Figure 6:
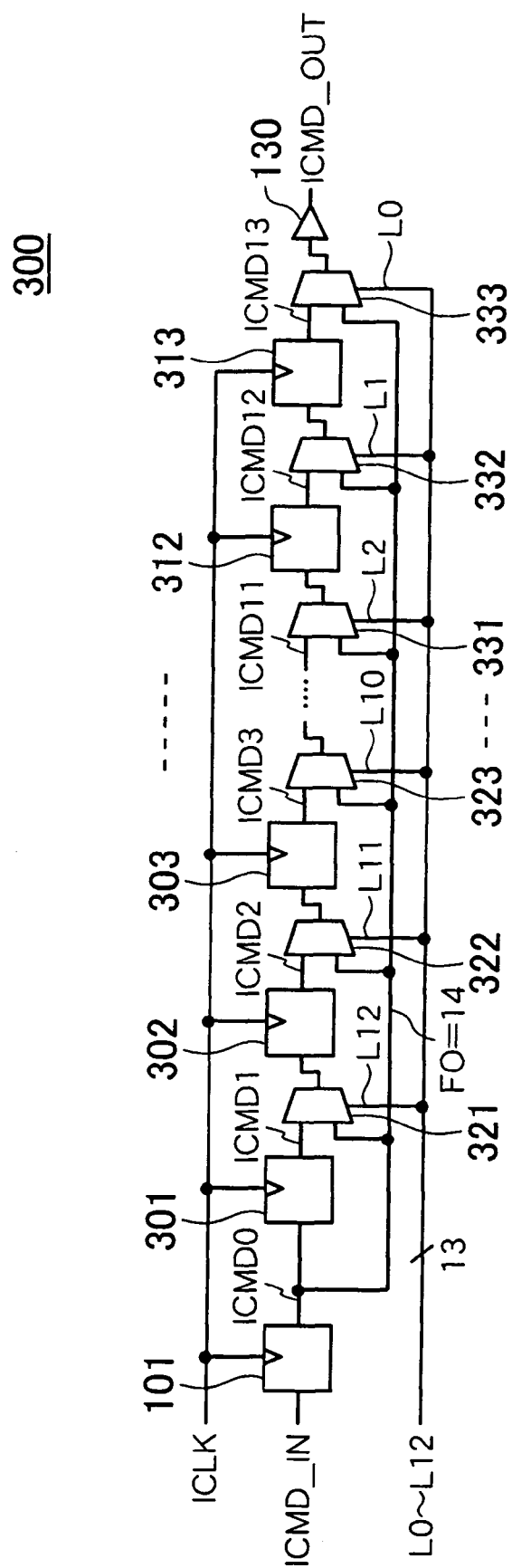
FIG. 6 is a circuit diagram showing a latency counter 300 as a comparative example.

In the comparative example shown in FIG. 6, a register 101 is followed by 13 registers 301 to 313, which are connected in cascade. The registers 301 to 313 are each followed by selectors 321 to 333. The registers 101 and 301 to 313 are circuits that each perform a latch operation in synchronization with a rising edge of an internal clock signal ICLK. To each of the selector 321 to 333, corresponding bits of control signals L0 to L12 are supplied. The control signals L0 to L12 are signals among which only one bit is brought to a high-level. An internal command signal ICMD0 is selected by a selector corresponding to a control signal that has been brought to a high level.

FIG. 7 is a table showing relationships between values of control signals L0 to L12 and latencies in the latency counter 300 in the comparative example. As shown in FIG. 7, in the comparative example, anyone bit of the control signals L0 to L12 is brought to a high level to select a register to which the internal command signal ICMD0 is supplied. Therefore, if the settable latency should take an arbitrary value ranging from 0 to 13, 13 bits are required for the control signals L0 to L12, resulting in an increase in the number of lines that transmit the control signals. Moreover, the internal command signal ICMD0 is commonly supplied to the 13 selectors 321 to 333, contributing to increasing a burden on the register 101 that outputs the internal command signal ICMD0 (Fan-out=14).

Meanwhile, in the latency counter 100 of the above-described first embodiment, seven bits of the control signals LE and L0 to L10 are enough to set the latency. Therefore, it is possible to reduce the density of wiring, which is used to transmit the control signals. Moreover, the number of selectors 123 to which the internal command signal ICMD0 should be commonly supplied is reduced to seven. Thus, it is possible to reduce by half the burden on the register 101 that outputs the internal command signal ICMD0 (Fan-out=7). Since the burden is reduced, it is possible to use a higher-speed clock signal.

The following describes a second embodiment of the present invention.

Figure 8:
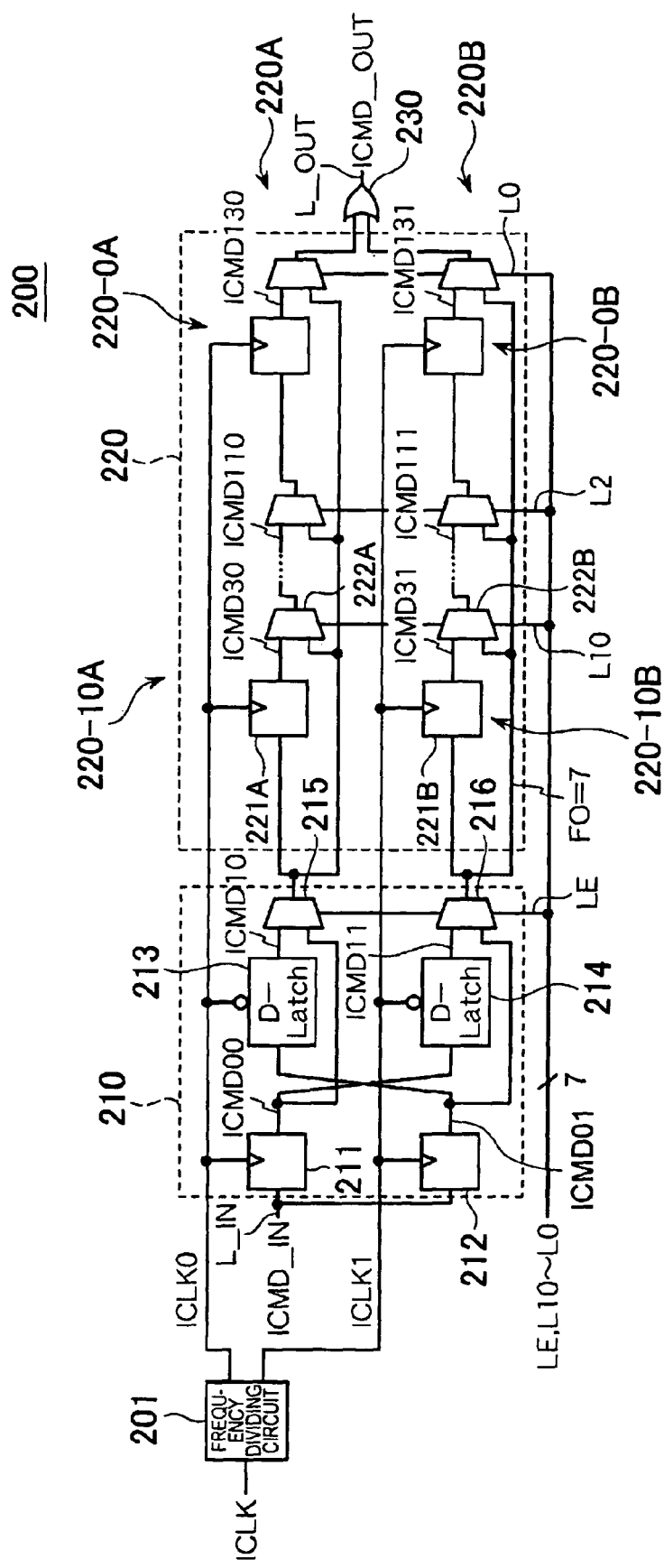
FIG. 8 is a circuit diagram showing the latency counter 200 shown in FIG. 2 according to a second embodiment.

Turning to FIG. 8, the latency counter 200 of the second embodiment includes a frequency dividing circuit 201, which generates first and second internal clock signals ICLK0 and ICLK1 by dividing the frequency of an internal clock signal ICLK by two. Therefore, the internal clock signals ICLK0 and ICLK1 have double the clock cycle of an external clock signal CK, are different in phase from each other by an amount equivalent to the clock cycle of the external clock signal CK.

Even in the present embodiment, the following components are connected in series between a command input line L_IN and a command output line L_OUT: a first latency counter 210, which selects whether to give an odd-cycle latency to an internal command signal; and a second latency counter 220, which gives a latency to an internal command signal at intervals of two cycles.

The first latency counter 210 includes a first register 211, which latches an internal command signal ICMD_IN in synchronization with an internal clock signal ICLK0; a second register 212, which latches the internal command signal ICMD_IN in synchronization with an internal clock signal ICLK1; a third register 213, which latches an internal command signal ICMD01 output from the second register 212 in synchronization with the internal clock signal ICLK0; and a fourth register 214, which latches an internal command signal ICMD00 output from the first register 211 in synchronization with the internal clock signal ICLK1.

Moreover, the first latency counter 210 includes a selector 215, which selects, on the basis of control information LE, the internal command signal ICMD00 output from the first register 211 or an internal command signal ICMD10 output from the third register 213; and a selector 216, which selects, on the basis of the control information LE, the internal command signal ICMD01 output from the second register 212 or an internal command signal ICMD11 output from the fourth register 214.

According to the above configuration, the selector 215 outputs the internal command signal ICMD_IN, which is supplied to the command input line LIN in synchronization with the internal clock signal ICLK0 or ICLK1, in synchronization with the internal clock signal ICLK0. Similarly, the selector 216 outputs the internal command signal ICMD_IN, which is supplied to the command input line L_IN in synchronization with the internal clock signal ICLK0 or ICLK1, in synchronization with the internal clock signal ICLK1.

In this case, the first register 211 performs a latch operation in synchronization with a rising edge of the internal clock signal ICLK0. The second register 212 performs a latch operation in synchronization with a rising edge of the internal clock signal ICLK1. The third register 213 performs a latch operation in synchronization with a falling edge of the internal clock signal ICLK0. The fourth register 214 performs a latch operation in synchronization with a falling edge of the internal clock signal ICLK1.

Figure 9:
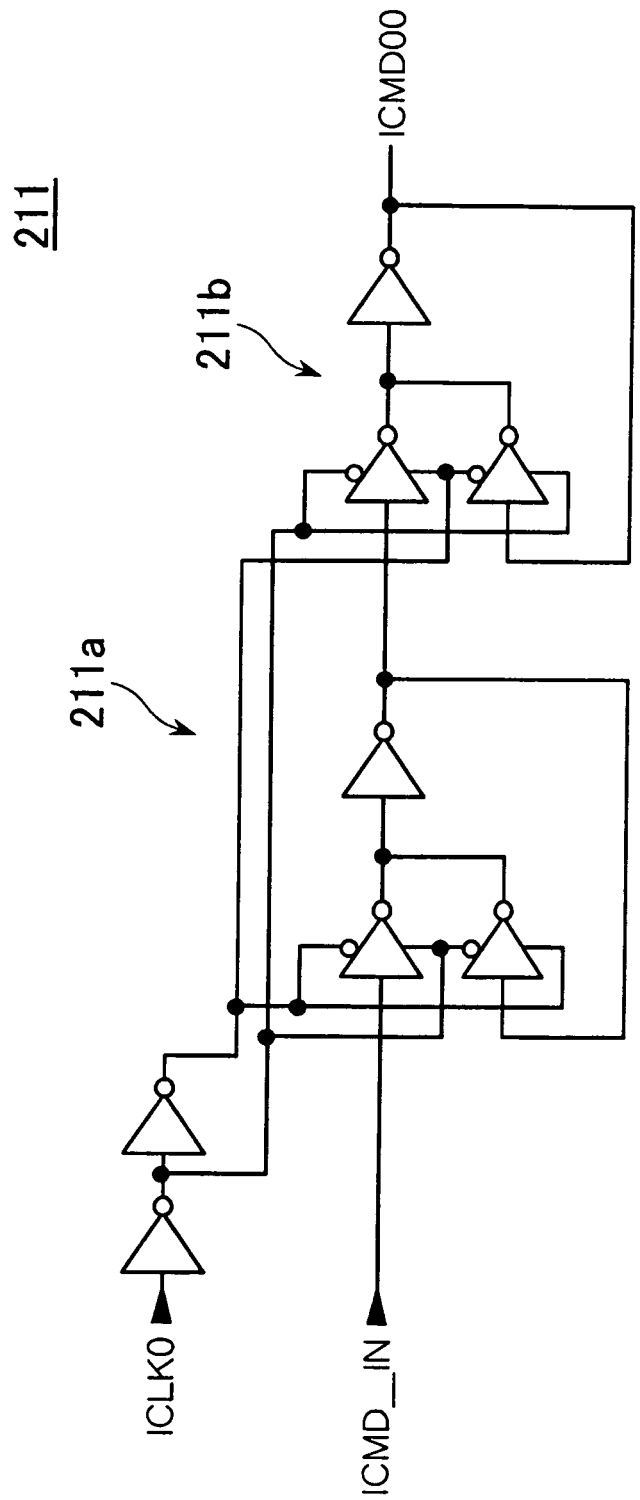
FIG. 9 is a circuit diagram showing a register 211 shown in FIG. 8.

Turning to FIG. 9, the register 211 is made by connecting the following circuits in cascade: a latch circuit 211a, which performs a latch operation at a time when the internal clock signal ICLK0 is at a low level; and a latch circuit 211b, which performs a latch operation at a time when the internal clock signal ICLK0 is at a high level. Accordingly, the internal command signal ICMD_IN input is captured in synchronization with a rising edge of the internal clock signal ICLK0, and the captured level is output until the next rising edge of the internal clock signal ICLK0 appears. The same is true for the register 212.

Figure 10:
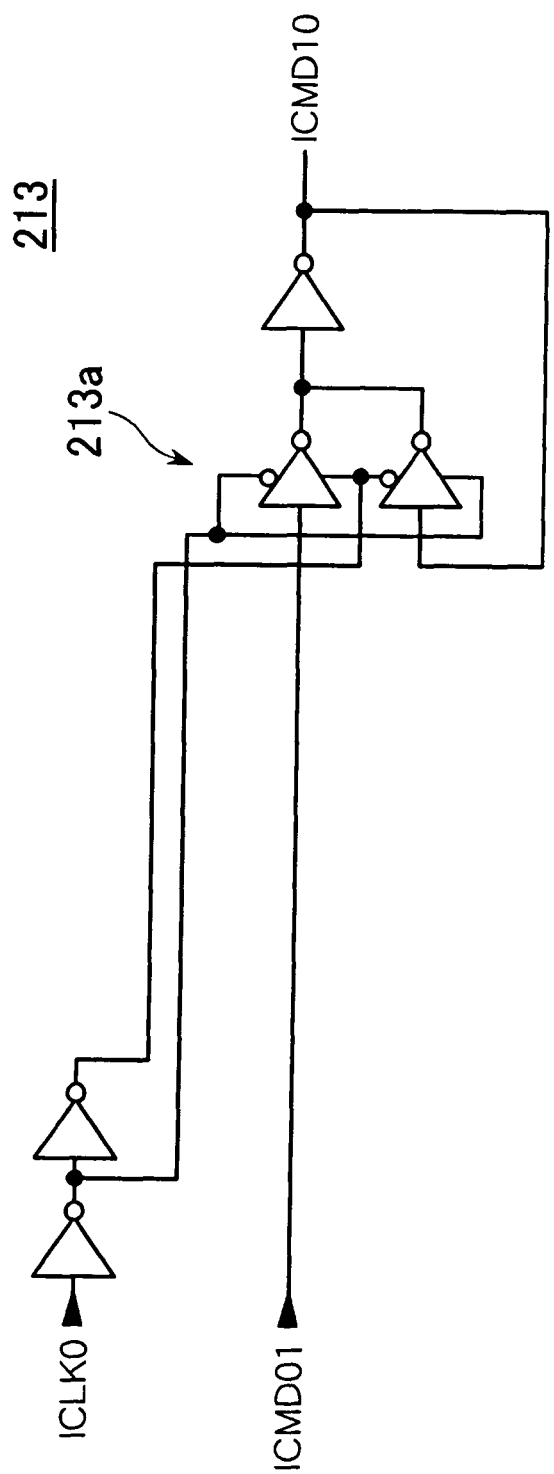
FIG. 10 is a circuit diagram showing a register 213 shown in FIG. 8.

Turning to FIG. 10, the register 213 includes a latch circuit 213a, which performs a latch operation at a time when the internal clock signal ICLK0 is at a low level. The register 213 does not have a circuitry section that performs a latch operation at a time when the internal clock signal ICLK0 is at a high level. Accordingly, the internal command signal ICMD01 input is output without being changed during a period in which the internal clock signal ICLK0 is at a high level, and is captured in synchronization with a falling edge of the internal clock signal ICLK0. That is, the register 213 is of a through-latch type. The same is true for the register 214.

In this case, the reason the operations of the registers 213 and 214 synchronize with a falling edge of the internal clock signal ICLK0 or ICLK1 is to expand a latch margin of the registers 213 and 214 over one clock cycle. That is, if the operations of the registers 213 and 214 synchronize with a rising edge of the internal clock signal ICLK0 or ICLK1, the latch margin of the registers 213 and 214 is one clock cycle. However, as in the present embodiment, if the operations of the registers 213 and 214 synchronize with a falling edge, a margin for latching the internal command signal ICMD01 in the register 213 and a margin for latching the internal command signal ICMD00 in the register 214 are 1.5 clock cycles.

The second latency counter 220 includes a first path 220A, which receives an output of the selector 215; and a second path 220B, which receives an output of the selector 216. Outputs of the paths 220A and 220B are supplied to an OR gate circuit 230, and are output as an internal command signal ICMD_OUT from the command output line L_OUT.

The first path 220A includes a structure in which a plurality of first synchronous circuits is connected in cascade: The first synchronous circuits latch an internal command signal in synchronization with the internal clock signal ICLK0. Similarly, the second path 220B includes a structure in which a plurality of second synchronous circuits is connected in cascade: The second synchronous circuits latch an internal command signal in synchronization with the internal clock signal ICLK1.

Each of the synchronous circuits that make up the first path 220A includes a register 221A and a selector 222A. To one input node of the selector 222A, an output of the register 221A is supplied. To the other input node, an output of the selector 215 is supplied. Similarly, each of the synchronous circuits that make up the second path 220B includes a register 221B and a selector 222B. To one input node of the selector 222B, an output of the register 221B is supplied. To the other input node, an output of the selector 216 is supplied.

To the selectors 222A included in the first path 220A and to the selectors 222B included in the second path 220B, corresponding bits of control signals L0 to L10 are supplied; one of the two input nodes of each of the selectors 222A and 222B is selected on the basis of the logic level corresponding bits of control signals L0 to L10. More specifically, when corresponding bits of the control signals L0 to L10 are at a low level, outputs of the registers 221A and 221B are selected. When corresponding bits of the control signals L0 to L10 are at a high level, outputs of the selectors 215 and 216 are selected. The control signals L0 to L10 are signals among which only one bit is activated to a high-level.

According to the above configuration, in the first path 220A, on the basis of the control signals L0 to L10, a selection is made as to which synchronous circuit an output of the selector 215 is supplied to. In the second path 220B, on the basis of the control signals L0 to L10, a selection is made as to which synchronous circuit an output of the selector 216 is supplied to. In other words, the number of synchronous circuits that an output of the selector 215 or 216 passes through is selected on the basis of the control signals L0 to L10. To clock nodes of registers 221A and 221B in the synchronous circuits, the frequency-divided internal clock signals ICLK0 and ICLK1 are supplied. Therefore, one synchronous circuit gives a delay of two clock cycles.

The relationships between values of the control signals LE and L0 to L10 and the latencies obtained are shown in FIG. 4. That is, when the latency is set to an even number, the control signal LE is set at a high level. When the latency is set to an odd number, the control signal LE is set at a low level. When any Li (i is equal to an even number ranging from 0 to 10) of the control signals L0 to L10 becomes activated, an i-clock-cycle count process is performed by the second latency counter 220. Since the latency counters 210 and 220 are connected in series, the settable latency is an arbitrary value ranging from 0 to 13.

Figure 11:
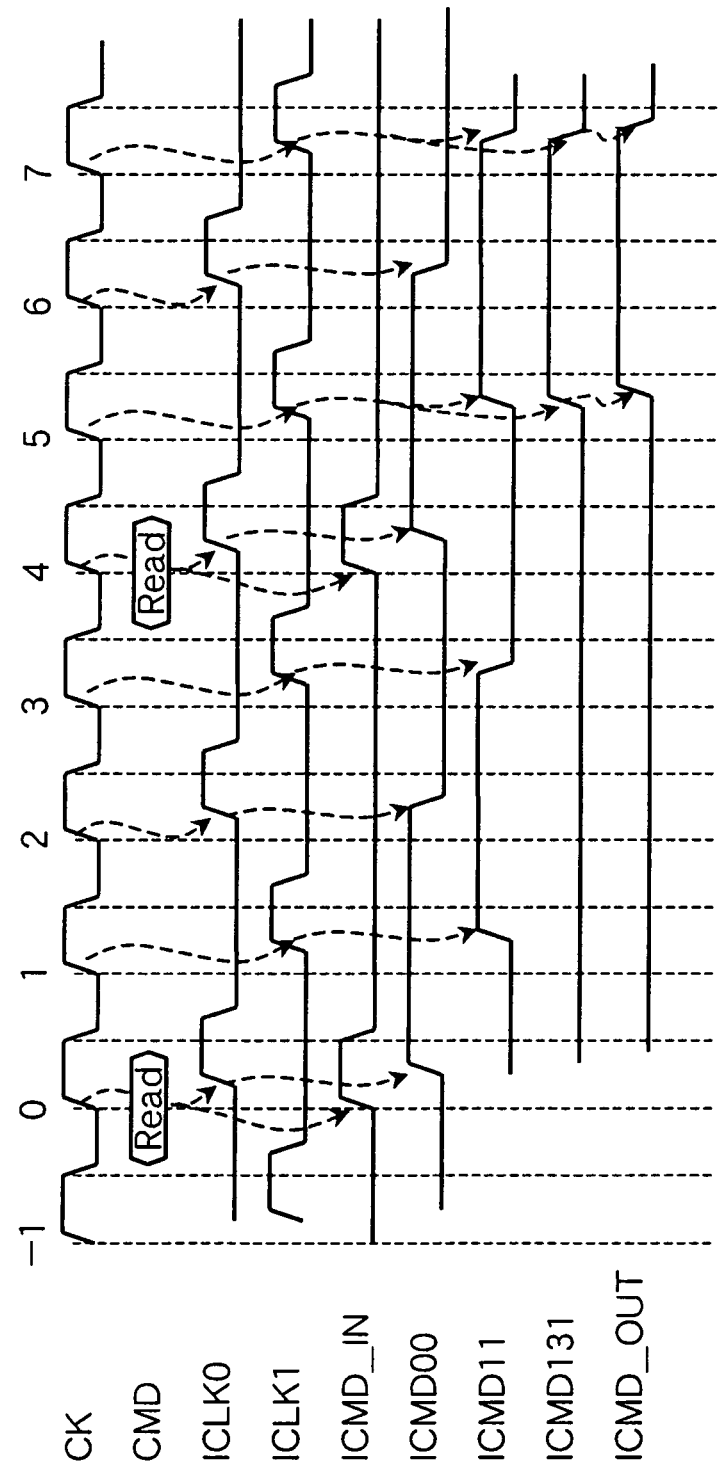
FIG. 11 is a waveform diagram illustrating an operation of the latency counter 200 shown in FIG. 8.

In the example shown in FIG. 11, the latency is set to five (AL=5). Accordingly, a control signal LE is at a low level, and a control signal L4 at a high level (See FIG. 4). As shown in FIG. 11, an internal clock signal ICLK0 becomes activated in synchronization with an even-numbered edge of an external clock signal CK. An internal clock signal ICLK1 becomes activated in synchronization with an odd-numbered edge of the external clock signal CK. A period during which the internal clock signal ICLK0 or ICLK1 is at a high level is equal to a period during which the external clock signal CK is at a high level. As a result, a period between one rising edge of the internal clock signal ICLK0 or ICLK1 and the other falling edge of the internal clock signal ICLK0 or ICLK1 is equal to 1.5 clock cycles of the external clock signal CK.

After a read command READ is issued in synchronization with active edge 0 of the external clock signal CK, the command decoder 32 generates an internal command signal ICMD_IN. The internal command signal ICMD_IN is latched by the register 211 shown in FIG. 8. As a result, what is generated is an internal command signal ICMD00 that is in synchronization with active edge 0 of an internal clock signal ICLK0.

The internal command signal ICMD00 is supplied to the register 214 and latched in synchronization with a falling edge of the internal clock signal ICLK1 before being output as an internal command signal ICMD11. In FIG. 11, in synchronization with a rising edge of the internal clock signal ICLK1, the internal command signal ICMD11 is output. The reason is that the register 214 is of a through-latch type, and that a signal input is output without being changed during a period in which the internal clock signal ICLK1 is at a high level.

The internal command signal ICMD11 output from the register 214 is supplied to the second path 220B in the latency counter 220 via the selector 216. Since the control signal L4 in the latency counter 220 is activated to a high level, the internal command signal ICMD11 is captured by the synchronous circuit 220-4B, which is second from the last synchronous circuit. Accordingly, a delay of four clock cycles is given by four registers in total, which are contained in the synchronous circuit 220-2B, which is first from the last synchronous circuit, and in the last synchronous circuit 220-0B.

As a result, a total delay of five clock cycles is given by the latency counters 210 and 220, and an internal command signal ICMD_OUT is output in synchronization with active edge 5 of the external clock signal CK.

As described above, according to the present embodiment, in addition to those in the first embodiment, the following advantageous effects can be obtained because the frequency-divided internal clock signals ICLK0 and ICLK1 are used: Power consumption in each register is reduced by half. As a result, it is possible to reduce power consumption of the entire latency counters. Moreover, the transfer between registers is basically two clock cycles; a section having the smallest margin is 1.5 clock cycles. Therefore, it is possible to use a higher-speed clock signal.

It is apparent that the present invention is not limited to the above embodiments, but may be modified and changed without departing from the scope and spirit of the invention.

For example, in each of the above-described embodiments, the first latency counter 110 or 210 and the second latency counter 120 or 220 are connected in series in that order. However, the order the latency counters are connected is not limited to the above. Contrary to the embodiments, the second latency counter 120 or 220 and the first latency counter 110 or 210 may be connected in series in that order.

Figures 12A, 12B:
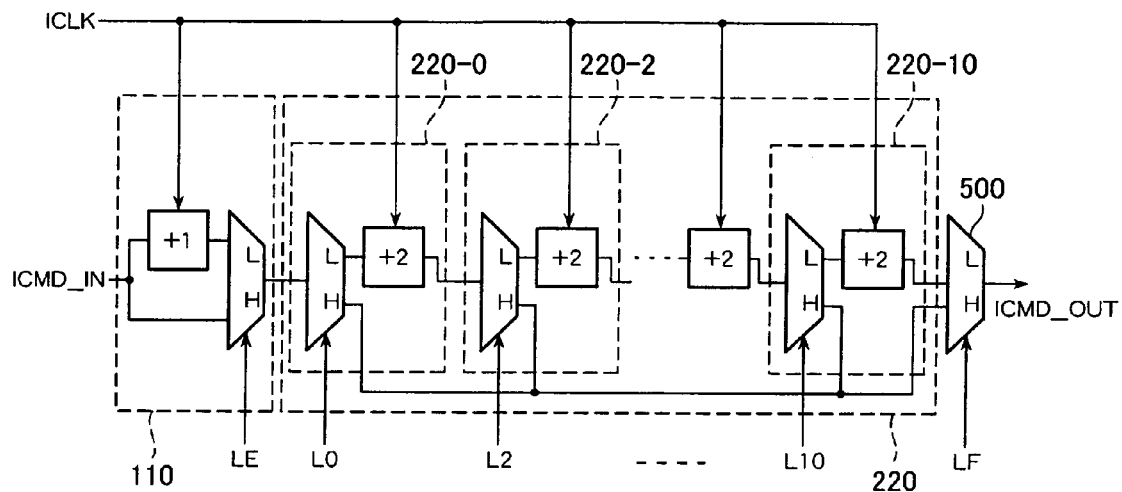
FIG. 12A is a circuit diagram showing a latency counter 100 in a first modified example of the first embodiment.
FIG. 12B is a table showing relationships between values of control signals LE, L0 to L10 and LF and latencies.

Moreover, in each of the above-described embodiments, in the second latency counter 120 or 220, a selector is used to select a synchronous circuit to which a signal is supplied. However, as in a first modified example shown in FIG. 12A of the first embodiment, a selector may be used to select an output from each synchronous circuit. In FIG. 12A, a latency counter 300 includes a first latency counter 110, a synchronous circuit 220 and a selector 500. The synchronous circuit 220 includes a plurality of synchronous circuits 220-0 to 220-10, each of which includes a selector, to which a signal is supplied, and a register, to which a signal is output from a first output node of the selector. The following are input into the selector 500: an output of the synchronous circuit 220; and second output nodes of the selectors that the synchronous circuits 220-0 to 220-10 have. The selector 500 outputs an internal command signal ICMD_OUT. The second output nodes of the selectors are a common one node. The selector 500 selects the output of the synchronous circuit 220 or the second output nodes of the selectors as an input on the basis of a third control signal LF. It is clear from a truth table of the control signal LE, a plurality of signals L0 to L10 and the third control signal LF shown in FIG. 12B that the third control signal LF is so controlled as to be a high level in the latencies 0 to 11, and a low level in the latencies 12 and 13.

Figure 13:
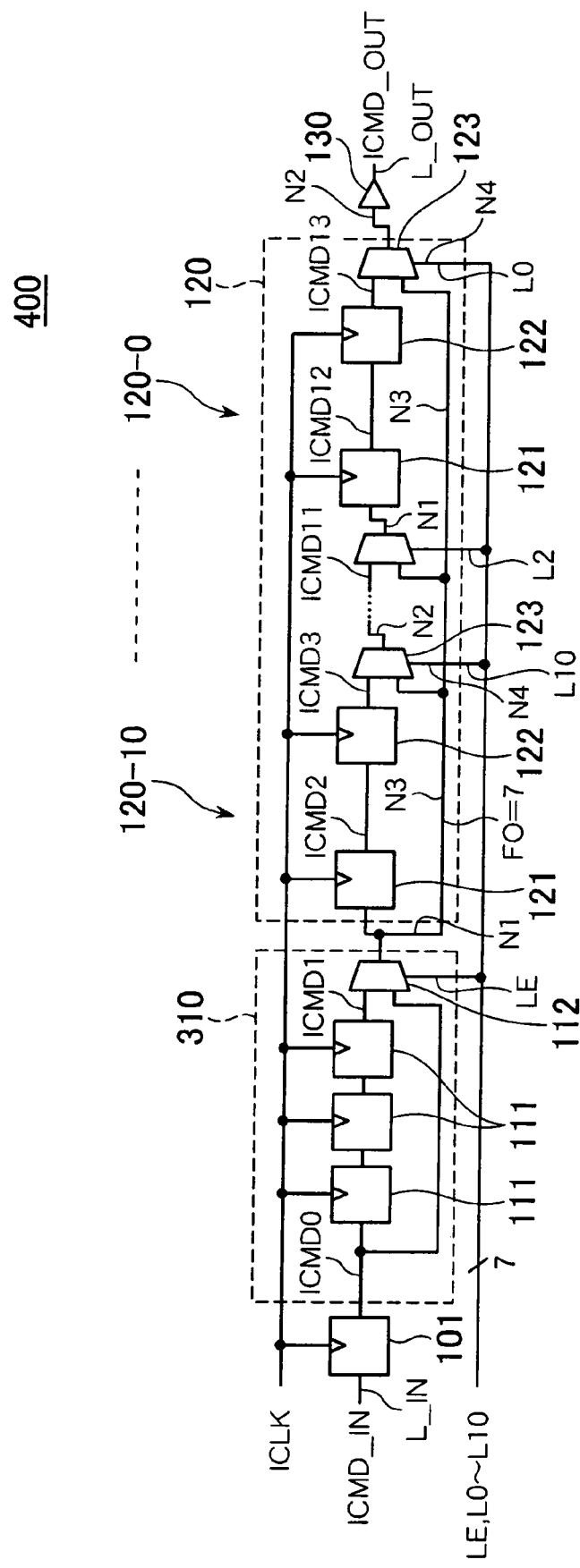
FIG. 13 is a circuit diagram showing a latency counter 400 in a second modified example of the first embodiment.

Moreover, in each of the above-described embodiments, in the first latency counter 110 or 210, a selection is made as to whether to give a delay of one clock cycle, and an even or odd latency is therefore selected. However, if a minimum latency is greater than or equal to two and if a process of setting a valid latency by a semiconductor device is a one-by-one latency step of 2 to 13, a selection may be made as to whether to give a delay of three or five clock cycles in the first latency counter 110 or 210, so that an even or odd latency is selected. For example, as in a second modified example of the first embodiment (latency counter 400) shown in FIG. 13, if a delay of three clock cycles is given in the first latency counter 310, the latency steps turn out to be 0, 2, 3, 4, 5, 6, 7, 8, 9, 10, 11, 12, 13 and 15. For example, if a delay of five clock cycles is given in the first latency counter 310, the latency steps turn out to be 0, 2, 4, 5, 6, 7, 8, 9, 10, 11, 12, 13, 15 and 17. That is, as long as the first latency counter 110 or 210 is designed to select whether to give an odd-cycle latency to an internal command signal input, the amount of delay thereof can be any value.

Figure 14:
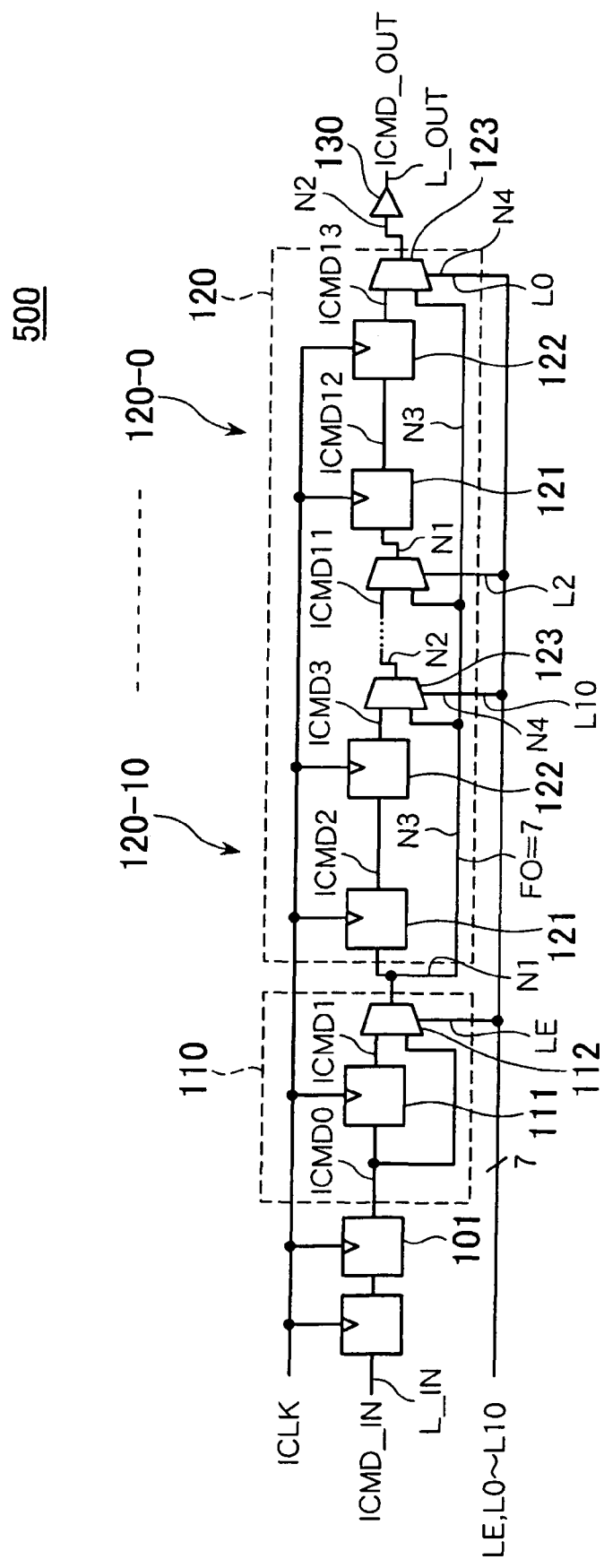
FIG. 14 is a circuit diagram showing a latency counter 500 in a third modified example of the first embodiment.

Moreover, for example, as in a third modified example of the first embodiment (latency counter 500) shown in FIG. 14, because of a structure in which two registers 101 are connected in series, as for the types of latency given to the internal command signal ICMD_IN, the values the latency can take per step range from 1 to 14. For example, because of a structure in which five registers 101 are connected in series, as for the types of latency given to the internal command signal ICMD_IN, the values the latency can take per step range from 4 to 17. What the above means is that a plurality of registers 101 puts an offset to the latency. Therefore, it is possible to make the latency counter 500 smaller in area, and to further reduce the density of wiring, which is used to transmit control signals.

Figure 15:
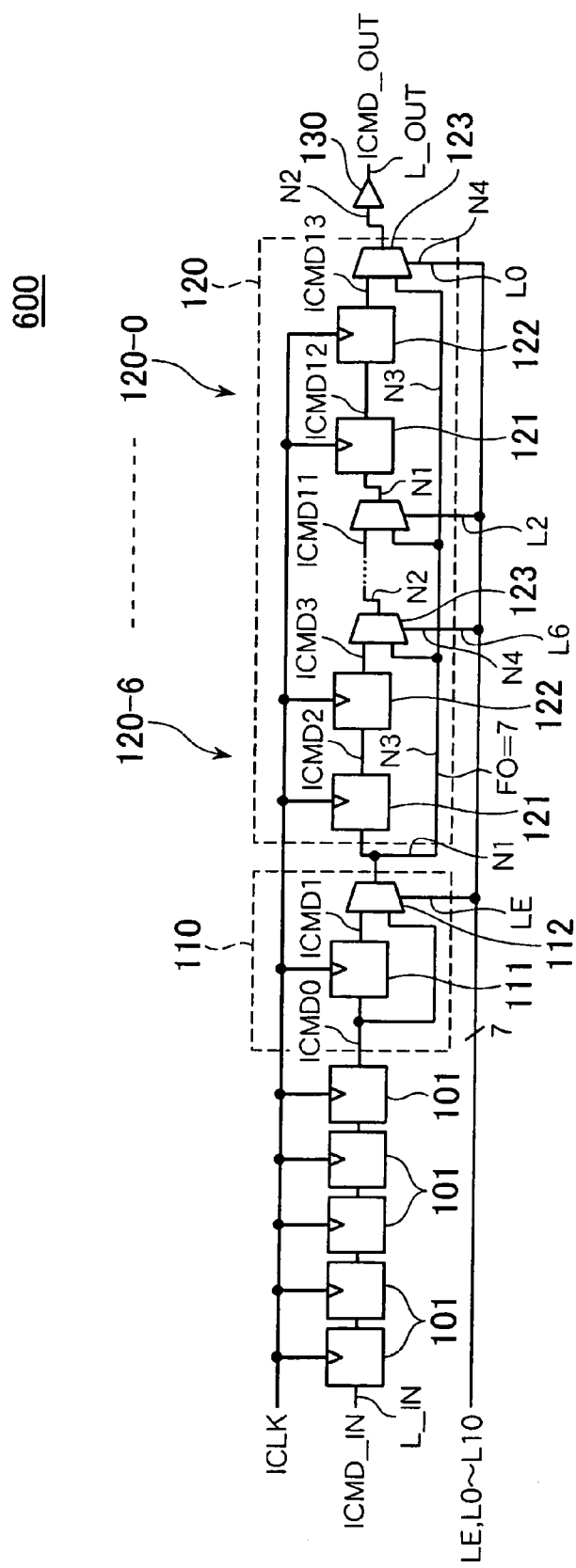
FIG. 15 is a circuit diagram showing a latency counter 600 in a fourth modified example of the first embodiment.

Moreover, for example, as in a fourth modified example of the first embodiment (latency counter 600) shown in FIG. 15, a latency counter may be modified in the following manner: Five registers 101 are connected in series, and four synchronous circuits 120-6 to 120-0 are provided. In this case, as for the types of latency given to the internal command signal ICMD_IN, the values the latency can take per step range from 4 to 13. That is, when the types of latency do not require 0 to 3 (i.e. a minimum latency is greater than or equal to four), the number of synchronous circuits 120 is reduced because of an offset of a plurality of registers 101. Therefore, compared with the first embodiment, out of seven-bit values (LE, L0, L2, L4, L6, L8 and L10) of the control signals LE and L0 to L10, five bits (LE, L0, L2, L4, L6) are sufficient. Thus, it is possible to make the latency counter 100 smaller in area, and to further reduce the density of wiring, which is used to transmit control signals.

Figure 16A:
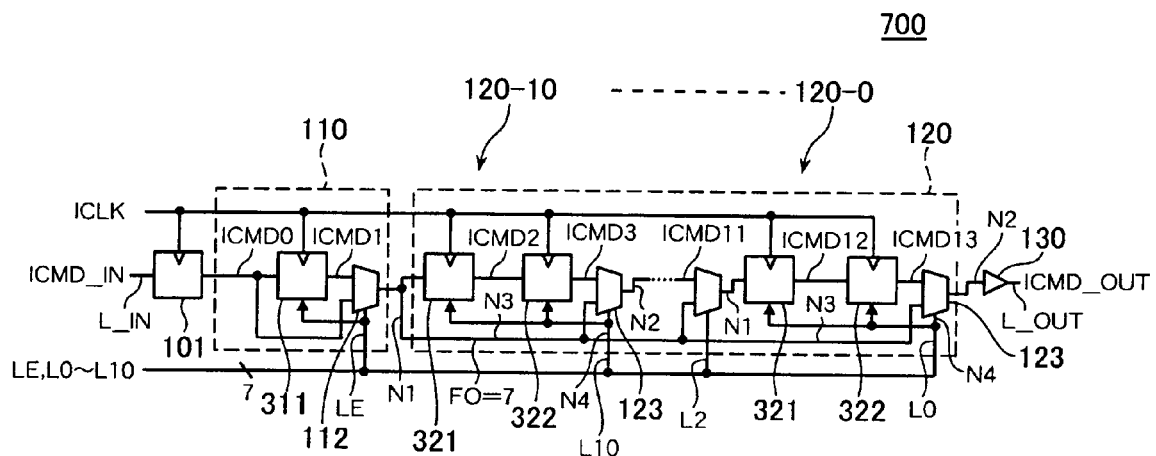
FIG. 16A is a circuit diagram showing a latency counter 700 in a fifth modified example of the first embodiment.
Figure 16B:
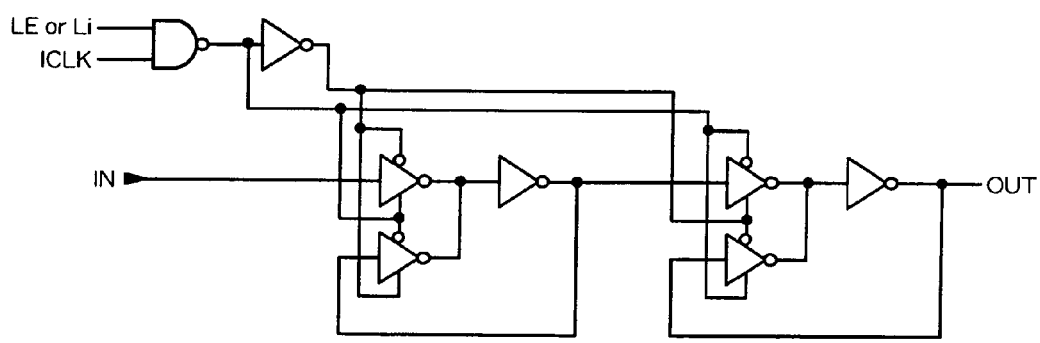
FIG. 16B is a circuit diagram showing a register 311, 321 and 322 shown in FIG. 16A.

Moreover, for example, as in a fifth modified example of the first embodiment (latency counter 700) shown in FIG. 16A, a first control signal LE may be a control signal of a clocked inverter in a corresponding register 311, and a plurality of second control signals L0 to Ln may be control signals of clocked inverters in a plurality of corresponding registers 321 and 322. In this case, it is possible to reduce power consumption of the first and second latency counters 110 and 120. When the first control signal LE represents a high level, the register 311 stops shifting. When the second control signals L0 to Ln represent a high level, the corresponding registers 321 and 322 stops shifting. Incidentally, circuits of the register 311 and the registers 321 and 322 are shown in FIG. 16B. The first control signal LE or the second control signals L0 to Ln controls an internal clock signal ICLK, thereby stopping the supply of the internal clock signal ICLK to a latch circuit. Incidentally, the second control signals L0 to Ln may be each supplied only to the register 321. Needless to say, the above can be applied to the second embodiment.

Moreover, in the above-described second embodiment, with the use of the ½ frequency-divided internal clock signals ICLK0 and ICLK1, transfer operations in the two paths 220A and 220B are each performed at intervals of two clock cycles. However, with the use of an internal clock signal whose frequency is divided by four or more and of four or more paths, a transfer operation in each path may be performed at intervals of four or more clock cycles.

The technical idea of the present application can be applied to circuits of various kinds of latency control (Read commands, write commands, ODT commands and the like). Moreover, a circuit type in each circuit block disclosed in the diagrams, as well as a circuit that generates other control signals, is not limited to a circuit type disclosed in an example.

The technical concept of the voltage level shift circuit of the present invention may be applied to various semiconductor devices. For example, the present invention may be applied to semiconductor products in general, including functions as CPUs (Central Processing Units), MCUs (Micro Control Units), DSPs (Digital Signal Processors), ASICs (Application Specific Integrated Circuits), ASSPs (Application Specific Standard Products), and memories. An SOC (System on Chip), an MCP (Multi Chip Package), and a POP (Package on Package) and so on are pointed to as examples of types of semiconductor device to which the present invention is applied. The present invention can be applied to the semiconductor device that has these arbitrary product form and package form.

When the transistors are field effect transistors (FETs), various FETs are applicable, including MIS (Metal Insulator Semiconductor) and TFT (Thin Film Transistor) as well as MOS (Metal Oxide Semiconductor). The device may even include bipolar transistors.

In addition, an NMOS transistor (N-channel MOS transistor) is a representative example of a first conductive transistor, and a PMOS transistor (P-channel MOS transistor) is a representative example of a second conductive transistor.

Many combinations and selections of various constituent elements disclosed in this specification can be made within the scope of the appended claims of the present invention. That is, it is needles to mention that the present invention embraces the entire disclosure of this specification including the claims, as well as various changes and modifications which can be made by those skilled in the art based on the technical concept of the invention.

What is claimed is:

1. A semiconductor device comprising:
a command input line;
a command output line; and
first and second latency counters connected in series between the command input line and the command output line, wherein
one of the first and second latency counters supplies an internal command signal to the command output line when a predetermined latency elapses after the internal command signal is supplied to the other of the first and second latency counters from the command input line,
the first latency counter selects whether to give the internal command signal an odd-cycle latency based on first control information, and
the second latency counter gives the internal command signal a latency at intervals of two cycles based on second control information.

2. The semiconductor device as claimed in claim 1, wherein the predetermined latency is an integral multiple of a clock cycle of an external clock signal supplied from outside.

3. The semiconductor device as claimed in claim 2, wherein the first latency counter includes:
a first register that latches the internal command signal in synchronization with an internal clock signal that has the same clock cycle as the external clock signal; and
a first selector that selects one of the internal command signal that has passed through the first register and the internal command signal that has not passed through the first register.

4. The semiconductor device as claimed in claim 3, wherein
the second latency counter includes a plurality of synchronous circuits,
each of the synchronous circuits includes second and third registers connected in series, and
each of the second and third registers latches the internal command signal in synchronization with the internal clock signal.

5. The semiconductor device as claimed in claim 4, wherein
the second latency counter further includes a plurality of second selectors each provided to an associated one of the synchronous circuits,
each of the second selectors select one of the internal command signal that passes through the second and third registers and the internal command signal that does not pass through the second and third registers based on an associated bit of the second control information.

6. The semiconductor device as claimed in claim 5, wherein
each one of the synchronous circuits and corresponding one of the second selectors constitute a set, the sets being connected in series, and
the internal command signal supplied to the second latency counter is supplied to any one of the synchronous circuits selected by the second selectors based on the second control information.

7. The semiconductor device as claimed in claim 2, further comprising a frequency dividing circuit that generates first and second internal clock signals each having double the clock cycle of the external clock signal, the first and second internal clock signals having different phase from each other by an amount equivalent to the clock cycle of the external clock signal,
wherein the first latency counter includes:
a first selector that outputs, based on the first control information, the internal command signal that is captured from the command input line in synchronization with one of the first and second internal clock signals; and a second selector that outputs, based on the first control information, the internal command signal that is captured from the command input line in synchronization with the other of the first and second internal clock signals.

8. The semiconductor device as claimed in claim 7, wherein
the first latency counter further includes:
a first register that latches the internal command signal on the command input line in synchronization with the first internal clock signal;
a second register that latches the internal command signal on the command input line in synchronization with the second internal clock signal;
a third register that latches the internal command signal output from the second register in synchronization with the first internal clock signal; and
a fourth register that latches the internal command signal output from the first register in synchronization with the second internal clock signal,
the first selector selects one of the internal command signals output from the first and third registers based on the first control information, and
the second selector selects one of the internal command signals output from the second and fourth registers based on the first control information.

9. The semiconductor device as claimed in claim 8, wherein
the first register performs a latch operation in synchronization with one of active edges of the first internal clock signal,
the second register performs a latch operation in synchronization with one of active edges of the second internal clock signal,
the third register performs a latch operation in synchronization with the other of active edges of the first internal clock signal, and
the fourth register performs a latch operation in synchronization with the other of active edges of the second internal clock signal.

10. The semiconductor device as claimed in claim 9, wherein
the third register passes through the internal command signal supplied from an input node thereof to an output node thereof without performing the latch operation during a period between the one of active edges and the other of active edges of the first internal clock signal, and
the fourth register passes through the internal command signal supplied from an input node thereof to an output node thereof without performing the latch operation during a period between the one of active edges and the other of active edges of the second internal clock signal.

11. The semiconductor device as claimed in claim 7, wherein
the second latency counter includes a plurality of first synchronous circuits, a plurality of second synchronous circuits, a plurality of third selectors and a plurality of fourth selectors,
each one of the first synchronous circuits and corresponding one of the third selectors constitute a first set, the first sets being connected in series,
each one of the second synchronous circuits and corresponding one of the fourth selectors constitute a second set, the second sets being connected in series,
each of the first synchronous circuits latches the internal command signal supplied thereto in synchronization with the first internal clock signal,
each of the second synchronous circuits latches the internal command signal supplied thereto in synchronization with the second internal clock signal,
each of the third selectors selects one of the internal command signal that passes through a corresponding first synchronous circuit and the internal command signal that does not pass through a corresponding first synchronous circuit based on an associated bit of the second control information, and
each of the fourth selectors selects one of the internal command signal that passes through a corresponding second synchronous circuit and the internal command signal that does not pass through a corresponding second synchronous circuit based on an associated bit of the second control information.

12. The semiconductor device as claimed in claim 11, wherein
the internal command signal supplied from the first selector is supplied to any one of the first synchronous circuits selected by the third selectors based on the second control information, and
the internal command signal supplied from the second selector is supplied to any one of the second synchronous circuits selected by the fourth selectors based on the second control information.

13. The semiconductor device as claimed in claim 1, further comprising a command decoder that generates the internal command signal based on an external command signal issued from outside, and supplies the command input line with the internal command signal.

14. The semiconductor device as claimed in claim 13, further comprising:
a memory cell array that includes a plurality of memory cells;
a row system control circuit that controls a timing of row access to the memory cell array; and
a column system control circuit that controls a timing of column access to the memory cell array,
wherein the column system control circuit operates in response to the internal command signal on the command output line.

15. The semiconductor device as claimed in claim 5, wherein
each bit of the second control information is supplied to an associated one of the synchronous circuits, and
each of the synchronous circuits invalidates an operation thereof in synchronization with the internal clock signal based on a logic level of the associated bit of the second control information.

16. The semiconductor device as claimed in claim 11, wherein
each bit of the second control information is supplied to an associated one of the first synchronous circuits and an associated one of the second synchronous circuits,
each of the first synchronous circuits invalidates an operation thereof in synchronization with the first internal clock signal based on a logic level of the associated bit of the second control information, and
each of the second synchronous circuits invalidates an operation thereof in synchronization with the second internal clock signal based on a logic level of the associated bit of the second control information.

17. A semiconductor device comprising:
a command input line;
a command output line; and
first and second latency counters connected in series between the command input and output lines, each of the first and second latency counters being supplied with a clock signal, the first latency counter being configured to represent a selected one of an odd-cycle latency and a zero-cycle latency of the clock signal in response to first control information, and the second latency counter being configured to represent a selected one of an even-cycle latency and a zero-cycle latency of the clock signal in response to second control information.

18. The device as claimed in claim 17, wherein the first latency counter is connected to the command input line and the second latency counter is connected between the first latency counter and the command output line.

19. The device as claimed in claim 17, wherein the second latency counter includes a plurality of unit circuits connected in series, each of the unit circuits giving a selected one of a two-cycle latency and a zero-cycle latency of the clock signal.

20. The device as claimed in claim 19, wherein the second control information includes a plurality of control signals each coupled to an associated one of the unit circuits, each of the unit circuits giving the two-cycle latency of the clock signal when an associated one of the control signals takes a first state and the zero-cycle latency of the clock signal when the associated one of the control signals takes a second state.

21. The device as claimed in claim 20, wherein the first latency counter represents a selected one of a one-cycle latency and a zero-cycle latency of the clock signal.

22. The device as claimed in claim 20, wherein the first latency counter represents a selected one of a three-cycle latency and a zero-cycle latency of the clock signal.

23. A semiconductor device comprising:
a command input line;
a command output line; and
first and second latency counters connected in series between the command input and output lines, each of the first and second latency counters being supplied with a clock signal, the first latency counter being configured to represent a selected one of an even-cycle latency and an odd-cycle latency of the clock signal in response to first control information, and the second latency counter being configured to represent a selected one of an even-cycle latency and a zero-cycle latency of the clock signal in response to second control information.

24. The device as claimed in claim 23, wherein the first latency counter includes first and second register circuits coupled in series and a first selector including a first input node receiving an output of the first register circuit and a second input node receiving an output of the second register circuit.

25. The device as claimed in claim 24, wherein the first selector selects the first input node when the first control information takes a first state and the second input node when the first control information takes a second state.

26. The device as claimed in claim 25, wherein the first latency counter further includes one or more additional register circuits coupled in series to the first register circuit.

27. The device as claimed in claim 23, wherein the first latency counter is coupled between the command input line and the second latency counter, and the second latency counter is coupled between the first latency counter and the command output line.

28. The device as claimed in claim 23, wherein the second latency counter is coupled between the command input line and the first latency counter, and the first latency counter is coupled between the second latency counter and the command output line.

29. The device as claimed in claim 24, wherein the first latency counter is coupled between the command input line and an intermediate node, and the second latency counter is coupled between the intermediate node and the command output 30. The device as claimed in claim 29, wherein the second latency counter includes a plurality of unit circuits connected in series, each of the unit circuits representing a selected one of an even-cycle latency and a zero-cycle latency of the clock signal.

31. The device as claimed in claim 30, wherein the second control information includes a plurality of control signals each coupled to an associated one of the unit circuits, each of the unit circuits representing an even-cycle latency of the clock signal when an associated one of the control signals takes a first state and a zero-cycle latency of the clock signal when the associated one of the control signals takes a second state.

32. The device as claimed in claim 30, wherein each of the unit circuits comprises a second selector including a first input terminal, a second input terminal, and an output terminal, a circuit node, and an even number of registers coupled in series between the first input terminal and the circuit node, each of the unit circuits being coupled such that the output terminal of a preceding one of the unit circuits is coupled to the circuit node of a succeeding one of the unit circuits and that the circuit node of a leading one of the unit circuits and the second terminal of each of the unit circuits are coupled to the intermediate node.

33. The device as claimed in claim 24, wherein the second latency counter is coupled between the command input line and an intermediate node, and the first latency counter is coupled between the intermediate node and the command output line.

34. The device as claimed in claim 33, wherein the second latency counter includes a plurality of unit circuits connected in series, each of the unit circuits representing a selected one of an even-cycle latency and a zero-cycle latency of the clock signal.

35. The device as claimed in claim 34, wherein the second control information includes a plurality of control signals each coupled to an associated one of the unit circuits, each of the unit circuits representing an even-cycle latency of the clock signal when an associated one of the control signals takes a first state and a zero-cycle latency of the clock signal when the associated one of the control signals takes a second state.

36. The device as claimed in claim 34, wherein each of the unit circuits comprises a second selector including a first input terminal, a second input terminal, and an output terminal, a circuit node, and an even number of registers coupled in series between the first input terminal and the circuit node, each of the unit circuits being coupled such that the output terminal of a preceding one of the unit circuits is coupled to the circuit node of a succeeding one of the unit circuits and that the circuit node of a leading one of the unit circuits and the second terminal of each of the unit circuits are coupled to the command input line.

37. The device as claimed in claim 23, further comprising:
a memory cell array that includes a plurality of memory cells;
a control circuit that reads out data from a selected one of the memory cells; and an output circuit that responds to a signal of the command output line to output a data signal indicative of the data.

38. The device as claimed in claim 23, wherein the even-cycle latency represented by the first latency counter excludes a zero-cycle latency.

* * * * *